(12) United States Patent
Zerbe et al.

(10) Patent No.: US 9,536,589 B2
(45) Date of Patent: *Jan. 3, 2017

(54) LOW-POWER SOURCE-SYNCHRONOUS SIGNALING

(71) Applicant: Rambus Inc., Sunnyvale, CA (US)

(72) Inventors: Jared L. Zerbe, Woodside, CA (US); Frederick A. Ware, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/445,014

(22) Filed: Jul. 28, 2014

(65) Prior Publication Data

US 2014/0334236 A1 Nov. 13, 2014

Related U.S. Application Data

(63) Continuation of application No. 12/738,610, filed as application No. PCT/US2008/069250 on Jul. 3, 2008, now Pat. No. 8,793,525.

(Continued)

(51) Int. Cl.
*G06F 1/04* (2006.01)
*G11C 11/4076* (2006.01)
(Continued)

(52) U.S. Cl.
CPC ............ *G11C 11/4076* (2013.01); *G06F 1/04* (2013.01); *G06F 13/4243* (2013.01);
(Continued)

(58) Field of Classification Search
None
See application file for complete search history.

(56) References Cited

U.S. PATENT DOCUMENTS

| 5,737,589 A | 4/1998 | Doi et al. |
| 6,279,090 B1 | 8/2001 | Manning |

(Continued)

FOREIGN PATENT DOCUMENTS

| WO | WO-99-17183 A1 | 4/1999 |
| WO | WO-2007-106766 A2 | 9/2007 |
| WO | WO-2007-106766 A3 | 9/2007 |

OTHER PUBLICATIONS

EP Office Action dated Nov. 9, 2010 re EP Application No. 08841143.4. 5 pages.

(Continued)

*Primary Examiner* — Dennis M Butler
(74) *Attorney, Agent, or Firm* — Lance Kreisman; Peninsula Patent Group

(57) ABSTRACT

A method of operating a memory controller is disclosed. The method includes transmitting data signals to a memory device over each one of at least two parallel data links. A timing signal is sent to the memory device on a first dedicated link. The timing signal has a fixed phase relationship with the data signals. A data strobe signal is driven to the memory device on a second dedicated link. Phase information is received from the memory device. The phase information being generated internal to the memory device and based on a comparison between the timing signal and a version of the data strobe signal internally distributed within the memory device. A phase of the data strobe signal is adjusted relative to the timing signal based on the received phase information.

20 Claims, 10 Drawing Sheets

Related U.S. Application Data

(60) Provisional application No. 60/981,777, filed on Oct. 22, 2007.

(51) Int. Cl.

| | | |
|---|---|---|
| *G06F 13/42* | (2006.01) | |
| *G11C 7/22* | (2006.01) | |
| *G11C 7/04* | (2006.01) | |
| *G11C 7/10* | (2006.01) | |
| *G11C 29/02* | (2006.01) | |
| *H04L 7/00* | (2006.01) | |

(52) U.S. Cl.
CPC .............. *G11C 7/1093* (2013.01); *G11C 7/22* (2013.01); *G11C 7/222* (2013.01); *G11C 7/04* (2013.01); *G11C 7/1078* (2013.01); *G11C 29/022* (2013.01); *G11C 29/023* (2013.01); *G11C 29/028* (2013.01); *G11C 2207/2254* (2013.01); *H04L 7/0008* (2013.01); *Y02B 60/1228* (2013.01); *Y02B 60/1235* (2013.01)

(56) References Cited

U.S. PATENT DOCUMENTS

| | | |
|---|---|---|
| 6,430,696 B1 | 8/2002 | Keeth |
| 6,662,305 B1 | 12/2003 | Salmon et al. |
| 7,016,259 B2 | 3/2006 | Jakobs |
| 7,058,150 B2 | 6/2006 | Buchwald et al. |
| 7,471,691 B2 | 12/2008 | Black et al. |
| 8,793,525 B2 * | 7/2014 | Zerbe et al. .................. 713/401 |
| 2004/0213067 A1 | 10/2004 | Best et al. |
| 2007/0217559 A1 | 9/2007 | Stott et al. |

OTHER PUBLICATIONS

EP Response dated May 18, 2011 to the Official Communication dated Nov. 9, 2010 re EP Application No. 08841143.4. 47 pages.

International Preliminary Report on Patentability dated May 6, 2010 (Chapter I) in International Application No. PCT/US2008/069250. 7 pages.

Preliminary Amendment dated Apr. 16, 2010 re U.S. Appl. No. 12/738,610, Includes Notification Concerning Submission of Priority Document and International Search Report. 8 pages.

\* cited by examiner (Prior-Art)

(Prior-Art)

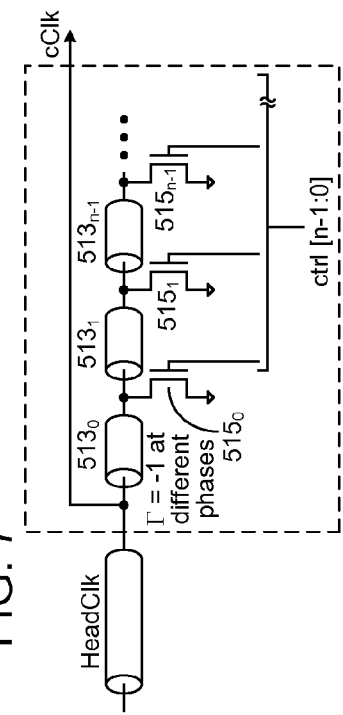
FIG. 5
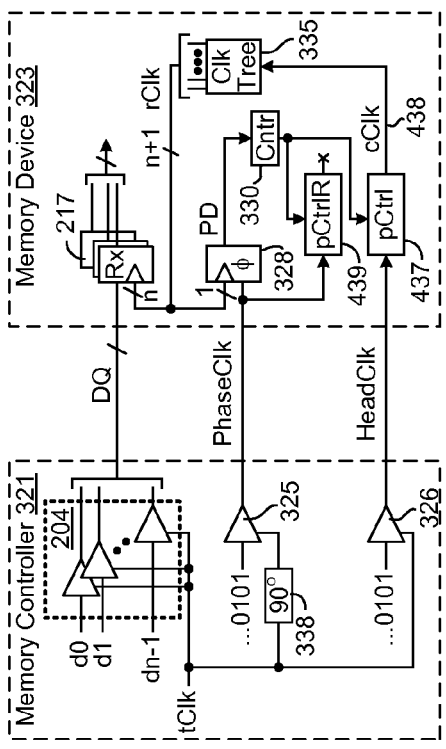
FIG. 6A
FIG. 6B
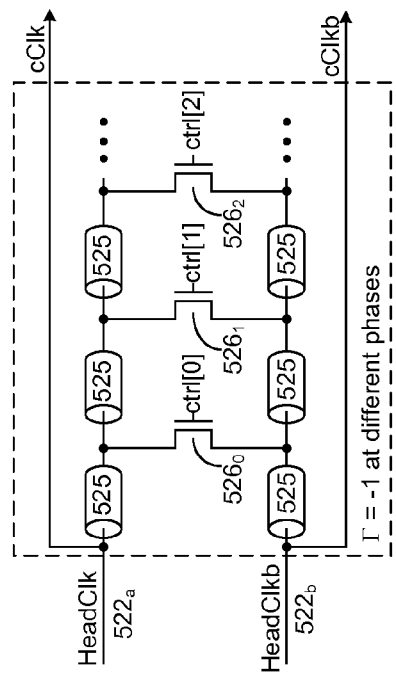
FIG. 7
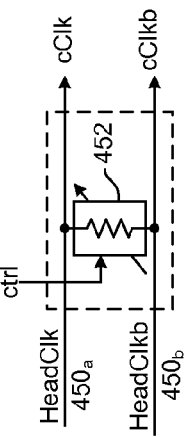
FIG. 8

LOW-POWER SOURCE-SYNCHRONOUS SIGNALING

CROSS-REFERENCE TO RELATED APPLICATIONS/TECHNICAL FIELD

Pursuant to 35 U.S.C. §365, this application is a Continuation of U.S. application Ser. No. 12/738,610, titled "Low-Power Source Synchronous Signaling", filed Apr. 16, 2010, which claims priority from International Application No. PCT/US2008/069250, published as WO 2009/055103 A2 on Apr. 30, 2009 and published as WO 2009/055103 A4 on Aug. 6, 2009, which claims priority from U.S. Provisional Application No. 60/981,777, filed Oct. 22, 2007 and entitled "Low-Power Source-Synchronous Signaling". U.S. application Ser. No. 12/738,610, International Application No. PCT/US2008/069250 and U.S. Provisional Application No. 60/981,777 are hereby incorporated by reference in their entirety. The disclosure herein relates to signal transfer between and among integrated circuit devices.

BACKGROUND

As modern signaling systems progress deeper into the gigahertz range, sources of previously-tolerable signal skew begin to present substantial sources of timing error. For example, in modern memory systems, source synchronous timing signals (strobe signals or clock signals) are often transmitted alongside corresponding groups of data signals, eight or sixteen data signals, for example, and used to control the data sampling time. By designing the signal transmission paths so that the timing signal and data signals experience similar propagation delays, the phase relationship established between the timing signal and data signals at the transmitting device may be maintained upon arrival of those signals at the receiving device. Despite this effort, fan-out differences between the timing and data signals at the receiving device (the timing signal is typically provided to sampling inputs of multiple receivers, while the data signal is provided to a single receiver input) yield different loading characteristics for the timing and data signal paths and thus produce skew between timing signal transitions and the desired data signal sampling point. Signal line loading may be equalized by providing a clock tree in the timing signal path (which also serves to meet the required clock fan-out), but the intrinsic delay of the clock tree itself presents a source of voltage and temperature dependent timing skew that generally requires active compensation.

FIG. 1A illustrates a prior-art memory system having a memory controller 101 to transmit strobe, data and clock signals to a memory device 103, which itself includes circuitry to adjust the phase of the incoming strobe signal (timing signal) as necessary to compensate for a voltage and temperature dependent delay in a clock tree. As shown, a transmit clock (tClk) is supplied to a set of n data drivers 105 which output an n-bit data word via data lines DQ0-DQn-1. The transmit clock is also supplied, via a quadrature delay element 107 (90° delay element) to a data strobe driver 109, which transmits a strobe signal via data strobe path DQS to the memory device. In the system shown, data is transmitted in response to each edge of the transmit clock signal, rising and falling, so that two bits are transmitted per tClk cycle. Accordingly, the quadrature delay element delays the data strobe signal by a half-bit time (one fourth of a tClk cycle or 90°) thus aligning the data strobe edge nominally with the center of the data eye (i.e., data valid interval) as shown in FIG. 1B.

Within memory device 103, the data strobe signal is supplied to a clock tree 115 which, in turn, replicates the data strobe in the form of multiple same-phase sampling signals (s0-sn-1) which are phase-delayed relative to the data strobe signal as shown in FIG. 1B according to the clock tree propagation delay. As shown, the sampling signals are supplied to respective receive circuits 117 to control the data sampling point for data signals arriving via data lines DQ0-DQn-1.

Because the clock tree propagation delay tends to be voltage and temperature dependent, an active locked-loop circuit 119 (e.g., delay-locked loop (DLL) or phase-locked loop (PLL)) is typically provided within the memory device and used to establish an actively-controlled propagation delay (i.e., by generating control signal, "ctrl") through a variable delay element 121 provided in the data strobe path. For example, the locked-loop circuit 119 may include a replica of the clock tree circuit 115 and variable delay element 121 within the loop feedback path so that the combined propagation delay of the clock tree circuit and delay element is adjusted, by the negative feedback loop, to match a bit time of the transmit clock (tClk cycle/2), thereby shifting the sampling signals (s0-sn-1) forward by the bit time less the clock tree propagation delay and thus establishing the sampling signal edge at a desired alignment with the data eyes of the incoming data signals. This phase adjusted signal is shown in FIG. 1B as signal s0' with delay equal to a bit time (BT) less clock tree delay (CDT).

In a typical implementation, a free-running master clock signal (mClk, which is usually mesochronously related to the transmit clock signal) is provided to the memory device 103 to establish a timing reference for the locked loop circuit 119. Consequently, though the arrangement of FIG. 1A is generally effective for deskewing the sampling signals, the presence of a continuously clocked circuit within the memory device results in considerable power consumption and heat generation; power loss and heating that is multiplied by the numerous memory devices typically included in a memory system.

BRIEF DESCRIPTION OF THE DRAWINGS

The disclosure herein is illustrated by way of example, and not by way of limitation, in the figures of the accompanying drawings and in which like reference numerals refer to similar elements and in which:

FIG. 5 illustrates another alternative system for establishing a desired, adaptively-updated data sampling point within a memory device without requiring a DLL, PLL or other continuously clocked circuitry within the memory device;

FIGS. 6A and 6B illustrate embodiments of phase control circuits that may be used to implement the phase control circuit depicted in FIG. 5 and that operate by adjusting an on-die termination impedance to increase or decrease the amplitude (F) of a reflected head clock signal, thus establishing an interference pattern that effects a positive or negative phase shift in the resultant control clock signal;

FIGS. 7 and 8 illustrate further alternative embodiments of a phase control circuit that may be used to implement the phase control circuit of FIG. 5 and that operate by controlling the length of a stub coupled to the head clock line and thus the magnitude and/or sign of a reflection that may be used to control the phase of the resultant control clock signal;

DETAILED DESCRIPTION

Figure 1B:
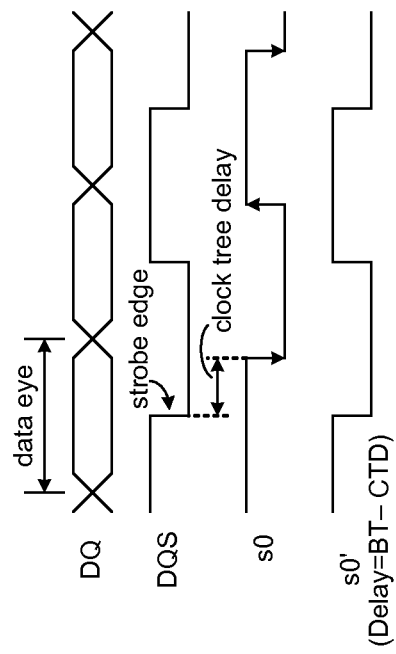
FIG. 1B is a timing diagram illustrating the relationship between data signals, data strobe signals and sampling signals within the memory device of FIG. 1A.
Figure 1A:
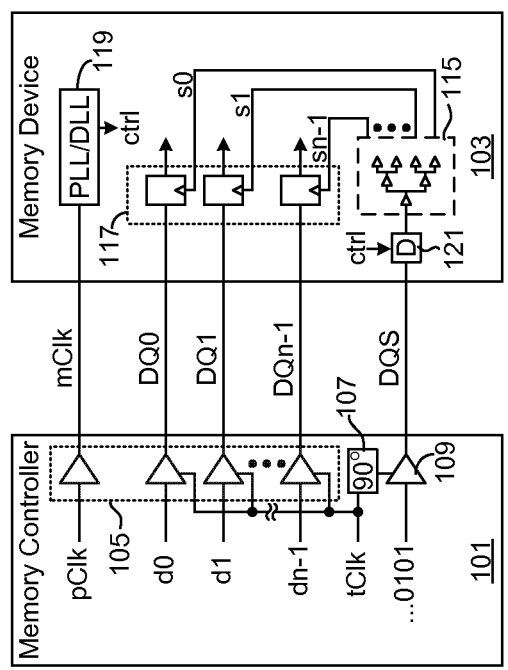
FIG. 1A illustrates a prior-art memory system having circuitry to adjust the phase of an incoming data strobe signal as necessary to compensate for a voltage and temperature dependent delay in a clock tree.

A signaling system that establishes and maintains a calibrated data sampling time within an integrated circuit device without need for continuously clocked circuitry within the integrated circuit devices is disclosed in various embodiments. In one embodiment, a timing calibration loop is closed through both a master device and a slave device, with all continuously clocked circuitry limited to the master device so that the slave device need only include loop components that consume dynamic power during periods of data transmission. In another embodiment, the slave device includes circuitry to close the timing calibration loop internally, avoiding the need to return the timing calibration information to the master device. In both cases, the timing calibration operations may be performed discontinuously, for example, only during periods of data transmission (though training data may be transmitted during extended idle periods to avoid phase drift), so that continuously clocked circuits may be omitted from slave device to reduce idle power consumption. In the case of a memory system, which is the model system for a number of embodiments disclosed in detail below but to which the techniques, circuits and principles discussed are in no way limited, applying discontinuous timing calibration to establish precise data sampling alignment, while at the same time obviating locked-loops or other continuously clocked circuits within the memory devices may yield a high-bandwidth memory system having substantially reduced power consumption relative to prior-art systems such as that shown in FIG. 1A. Further, in addition to the power savings achieved through discontinuous timing calibration, timing signals supplied to the slave devices may have an arbitrary phase with respect to data signals in selected embodiments, meaning that the source-synchronous strobe signals prevalent in modern memory systems (and typically provided in multiple instances) may be omitted in favor of a reduced number of reference timing signals. In at least one embodiment, signaling resources otherwise used to convey strobe signals may be reallocated to enable point-to-point delivery of control information, substantially increasing control bandwidth.

Figure 2A:
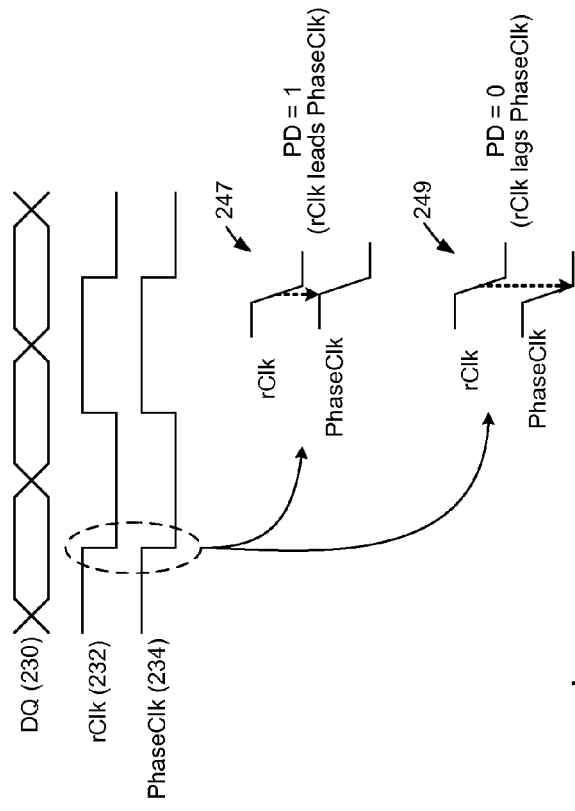
FIG. 2A illustrates an embodiment of a high-bandwidth memory system in which continuously clocked circuits have been limited to a memory controller component, thus enabling memory devices to be implemented without need for locked loops or other power-consuming timing circuitry.

FIG. 2A illustrates an embodiment of a high-bandwidth memory system that employs discontinuous timing calibration to reduce idle power consumption. More specifically, in contrast to the system of FIG. 1A which includes continuously clocked DLL and/or PLL circuitry within each memory device, continuously clocked circuits have been limited to a memory controller 201, thus enabling memory devices (exemplified by memory device 203) to be implemented without need for on-chip locked loops or other power-consuming timing circuitry. As shown, the memory controller 201 includes a number of data transmission circuits 204 each to transmit a data signal (d0, d1, . . . , dn−1) over a respective data link (shown collectively as data links DQ 210) in response to a transition of a transmit clock signal, tClk. In the embodiment shown, and other embodiments disclosed below, respective data bits are transmitted on each data link in double-data rate fashion during odd and even phases of the transmit clock cycle. That is, in the embodiment of FIG. 2A and other embodiments discussed below, two bits are transmitted in succession during each tClk cycle, one in response to a rising tClk edge and one in response to a falling tClk edge, though the number of bits transmitted per wire per clock cycle may be higher or lower in alternative embodiments. The tClk signal is also used to control transmission, within transmission circuit 206, of a timing signal, referred to herein as a head clock signal (HeadClk), via signaling link 218. In the embodiment shown, the head clock signal is received within the memory device 203, and replicated within a clock tree circuit 221 to provide multiple same-phase instances of a sampling clock signal referred to herein as a receive clock 232 (rClk). The receive clock instances are supplied to respective receivers (or respective groups of receivers depending on the tolerable fan-out), shown collectively as receiver 217 to trigger data sampling operations therein (i.e., control the time at which the incoming data signal is sampled within each of the receivers). It should be noted that while the term "clock" is used to describe the various timing signals such as the head clock signal, receive clock signal and, as discussed below, phase clock signal (PhaseClk) output by transmission circuit 206, such signals may be generated either as periodic clock signals or as non-periodic strobe signals (signals that do not toggle during so called "idle periods" in which no data transmission is required), with the latter being preferred for low power applications to avoid continuous clocking (and concomitant dynamic power consumption) within the memory device. For example, during idle periods, the same state-value ('1' or '0') may be repeatedly transmitted in response to tClk transitions to effect a steady-state timing signal output on the HeadClk and/or PhaseClk lines. Also, while a single memory device 203 is shown, numerous such memory devices may be provided within the memory system, as where multiple memory devices are provided to form one or more ranks of memory devices (i.e., groups of memory devices that may be simultaneously selected for data write or read) on a memory module or multiple memory modules (in such an embodiment, multiple HeadClks may be provided, one per slave device, though the PhaseClk may be shared). Further, while controller-to-device data transfer (i.e., write data transfer) is emphasized in the embodiment of FIG. 2A and other embodiments disclosed herein, the various data signal links may be bidirectional to accommodate device-to-controller data transfer (i.e., read data transfer) and/or other links may be provided for that purpose. With respect to read data timing, because continuously clocked circuits are provided on the memory controller (e.g., to establish a master clock for generating other clocks within the memory controller), clock-data-recovery techniques or other timing arrangements may be employed to establish desired sampling points for data transmission from the memory device to the controller via DQ links 210.

Still referring to FIG. 2A, the memory controller also outputs a timing signal, referred to herein as PhaseClk, via signal link 216. In one implementation, PhaseClk is phase-shifted by 90° relative to the edges of data eyes (i.e., valid data interval for each data signal transmitted on a respective DQ link) and thus, by virtue of the half-tClk-cycle (i.e., 180°) interval of the data eyes, nominally aligned with the data eye midpoint as shown by signal 234 in FIG. 2B. In the embodiment shown, the 90° phase shift between the PhaseClk and data signals is achieved by supplying tClk to a 90° delay element 225 and thus producing a 90°-phase-shifted version of tClk (tClk90) that is used to time the PhaseClk output. Although not specifically shown, the memory controller 201 may include a PLL and/or DLL to synthesize the transmit clock and other internally-applied clock signals, with the propagation delay in 90° delay element 225 controlled through inclusion of an identical 90° delay element within the locked loop to establish an appropriate delay control signal that is additionally applied to delay element 225.

Figure 2B:
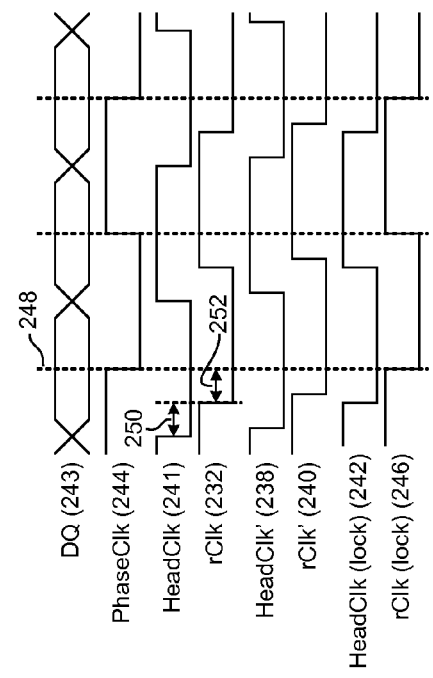
FIG. 2B illustrates a relationship between a data signal, receive clock signal, and phase clock signal within the system of FIG. 2A, and more specifically the manner in which the phase clock signal may be sampled to generate an early/late phase indication.

Because the phase clock signal is quadrature-aligned to the data signal (i.e., nominally aligned with midpoints in the data eyes as shown in FIG. 2B), transitions of the phase clock signal represent a desired data sampling point for the incoming data signal at memory device 203. Thus, by sampling the phase clock signal within receiver 219 in response to the rClk signal, which has propagated through (and incurred the delay of) the clock tree, a phase detection circuit is effected. That is, in contrast to the prior-art technique described in reference to FIG. 1A, the quadrature timing signal PhaseClock is not itself fanned-out to provide data sampling signals (which fan-out may result in phase error as discussed above due to unequal data and timing signal loading and/or clock tree delay in the timing signal path), but rather is sampled itself within a receiver 219 designed to match the operational characteristics of the receivers used to sample the data signals. Thus, if rClk is aligned with the desired data sampling point, rClk will sample the phase clock signal precisely during phase clock transition and thus nominally yield a balanced number of logic high and logic low phase samples 212 (PD, for phase-detect values). By contrast, if rClk lags the desired data sampling point, the phase clock signal will be sampled predominantly after phase clock transition and thus yield logic low phase sample values as shown at 249 in FIG. 2B (or logic high phase sample values, if the rising edge of rClk is used to sample the rising edge of phase clock; note that logic circuitry may be provided to selectively invert the state of the phase sample according to the direction of the phase clock transition). Similarly, as shown at 247 in FIG. 2B, if rClk leads the desired sampling point, the phase clock signal will be sampled predominantly before the phase clock transition and thus yield logic high sample values as shown at 247 (or logic low phase sample values if the rising edge of rClk is used to sample the rising edge of phase clock). In either case, a sequence of phase samples exhibiting a predominance in one logic state or the other will be generated and thus effect a phase control signal (or phase control information) that indicates whether rClk transitions are occurring early (leading) or late (lagging) relative to the target, phase clock transitions. In the embodiment of FIG. 2A, the early/late information represented by the stream of phase samples 212 is returned to the memory controller 201 via a back channel 220 (e.g., a common mode signaling channel on a differential signaling link or any other signal communication path) or dedicated communication path (e.g., a relatively low-speed signaling link for transmission of timing control or other control information) and supplied to an up/down counter 211 which responsively increments or decrements a count value 222. The count value 222 (also referred to herein as a control value), or at least some portion of the most significant bits thereof, is provided to a variable delay element 209 (e.g., a delay line) to increase or decrease (i.e., adjust) a phase offset between the transmit clock signal (tClk) and a delayed transmit clock signal (tClk-d) that is used to trigger output of the head clock signal onto signaling link 218. By this arrangement, when the sequence of phase samples 212 (i.e., early/late signal or early/late information) predominantly indicates that the receive clock signal lags the desired data sampling point, the count value decreases (i.e., the count value is decremented more than incremented), resulting in a smaller propagation delay through delay element 209 and thus a corresponding phase-advance within the head clock signal and therefore within receive clock signal 232. Conversely, when the sequence of phase values 212 predominantly indicate that the receive clock signal leads the desired data sampling point, the count value increases, increasing the propagation delay through delay element 209 and thus retarding the phase of the head clock signal and receive clock signal. Thus, overall, the phase detection circuitry within the memory device 203 and the clock phase adjustment circuitry within the memory controller 201 are coupled to form a system-wide (i.e., inter-device) negative feedback loop that operates to drive the receive clock into phase alignment with the phase clock signal and thus into alignment with the desired sampling point within the incoming data signals. In this way, clock recovery is effectively distributed between the memory controller 201 and the memory device 203.

Figure 2C:
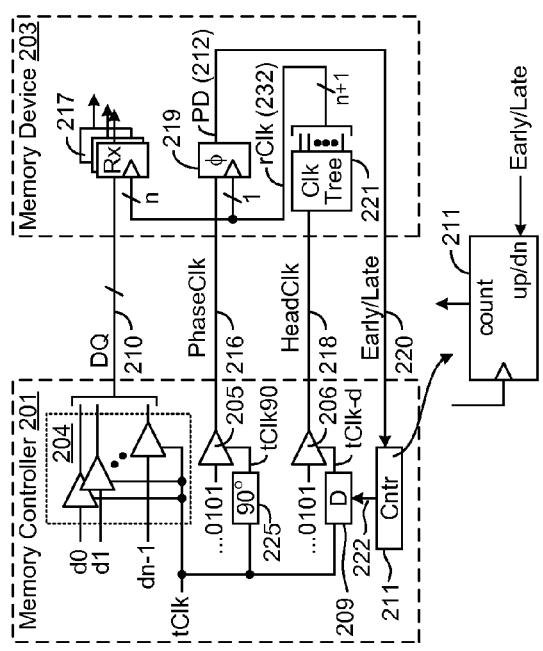
FIG. 2C illustrates an iterative adjustment of the phase of the head clock signal and receive clock signal within the system of FIG. 2A, and the eventual phase lock achieved.

The iterative nature of the receive-clock-to-phase-clock phase alignment is illustrated in FIG. 2C. As shown, the receive clock signal (232) and head clock signal (241) are offset from one another by the clock tree delay 250, and the receive clock signal 232 is initially offset from a desired data sampling point 248 (the phase clock transition point) by an arbitrary phase error 252. In the example shown, the receive clock 232 lags the phase clock 244 so that the count value within counter 211 is reduced to lower the propagation delay within delay element 209 and thus iteratively advance the phase of the head clock and receive clock signals (241 and 232) to establish phase-adjusted signals HeadClk' 238 and rClk' 240. Eventually, when the early/late signal begins to toggle back and forth between early and late indications, the head clock and receive clock signals will reach phase-locked positions illustrated in FIG. 2C by the signals designated HeadClk(lock) 242 and rClk(lock) 246. Note that, while not separately shown, a filter circuit may be provided within the memory device or memory controller to average or otherwise smooth the sequence of phase samples and thus reduce jitter in the head clock and receive clock signals. For example, by limiting the count value 222 output by the counter to M-bits of an otherwise N-bit value (where M<N), the counter 211 operates as an averaging filter as the accrued difference between the number of phase-lead and phase-lag indications must rise by $2^{(N-M)}$ for each corresponding increment or decrement of the M-bit count value 222. Also, a deadband may be employed to reduce clock jitter in the lock zone (i.e., once the early/late signal begins to toggle to a desired extent (which may be fixed, dynamically determined and/or programmatically established within the memory controller 201), changes in the count value 222 may be suspended until the early/late information indicates a given level of drift away from lock.

Reflecting on the operation of the memory system of FIG. 2A, it can be seen that, if the phase clock signal and head clock signal are implemented by strobe signals (i.e., toggling only when data is being transferred over the data path, and during any preamble and/or postamble interval which may be desirable), no continuously clocked signals need be provided to the memory device (thus saving power within the memory device during idle periods) and yet the phase of the signal used to trigger data sampling operations (rClk) may be adjusted as necessary to sample incoming data signals at the desired sampling point, thereby accounting for temperature and voltage-dependent timing drift, including any drift in the propagation delay through clock tree 221. Also, because the phase clock receiver 219 is designed to match the operational characteristics of receivers 217, the setup and hold times of receivers 217 are effectively modeled within the closed loop timing adjustment operation and thus compensated for by the inter-device feedback loop.

Figure 3:
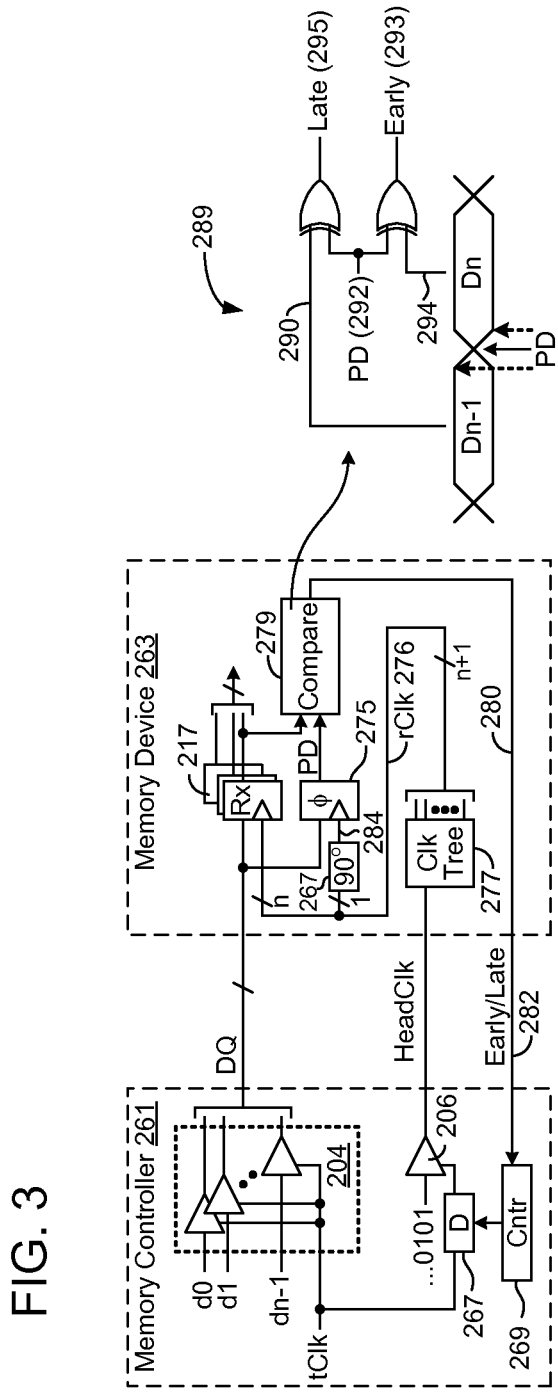
FIG. 3 illustrates an alternative system for establishing a desired, adaptively-updated data sampling point within a memory device without requiring a DLL, PLL or other continuously clocked circuitry within the memory device.

FIG. 3 illustrates an alternative embodiment of a memory system that employs discontinuous timing calibration to establish a desired, adaptively-updated data sampling point within a memory device without requiring a DLL, PLL or other continuously clocked circuitry within the memory device. As in the system of FIG. 2A, a memory controller 261 includes transmission circuitry 204 to output data values d0-dn−1 via respective DQ links in response to a transmit clock signal, tClk, and also a transmit circuit 265 (also referred to herein as an output driver) to output a head clock signal 265 in response to a delayed tClk signal, tClk-d. In contrast to the embodiment of FIG. 2A, however, the memory controller 261 does not output a quadrature-aligned clock signal (phase clock signal), and instead, such quadrature-aligned signal is synthesized on the memory device 263. More specifically, the head clock signal is received within the memory device 263 and provided to a clock tree circuit 277 to yield a receive clock signal 276 having the fan out desired to trigger data sampling operations within data receivers 217. The receive clock signal 276 is also provided to a 90° delay element 267 to yield an edge clock signal, eClk 284, that is used to sample the data signal within edge-sampling receiver 275. By providing data and edge clocks in this manner (rClk and eClk), samples of the data signal may be captured nominally at the center of the data eye (within one of receivers 217) and at the transition between data eyes (within edge-sampling receiver 275), respectively, and applied to compare logic 279 as shown to yield early/late information 280. In one embodiment shown in detail view 289, for example the phase samples (PD, also referred to herein as edge samples) are exclusively ORed with the preceding and succeeding data sample (Dn−1 and Dn) of at least one of the receivers 217 to generate early and late signals, 293, 295. The early/late information thus obtained may be understood by considering the deviation from an ideal alignment between the edge clock signal 284 and the data signal transition. That is, if the receive clock signal 276 leads the desired data sampling point (and thus the edge clock signal 284 leads the data signal transition), a transition of the data signal will yield an edge sample (PD) that is different from the succeeding data sample, Dn (294), thus indicating by assertion of an early signal (Early) that the edge sample was captured early relative to the desired sampling point, and, accordingly, that the rClk and eClk signals transitioned early relative to their desired transition points (i.e., rClk and eClk lead their desired phase angles). Similarly, if the receive clock signal 276 lags the desired data sampling point (so that the edge clock signal 284 also lags the data signal transition), a transition of the data signal will yield an edge sample that is different from the preceding data sample, Dn−1 (290), thus indicating by assertion of a late signal (Late) that the edge sample was captured late and accordingly that the rClk and eClk signals transitioned late relative to their desired transition points (i.e., rClk and eClk lag their desired phase angles). While not specifically shown, a filter circuit may be provided within the memory device or memory controller to average or otherwise smooth the sequence of phase samples and thus reduce jitter in the head clock and early/late signals.

As in the embodiment of FIG. 2A, the early/late signals 293, 295 (which may be merged into a single early/late logic signal) are supplied via back channel 282 to the memory controller 261 and applied to up/down inputs of a counter 269 to control the propagation delay of variable delay element 267. More specifically, if the early/late information 280 (e.g., a sequence of early/late signals 293, 295) predominantly indicates that the receive clock signal 276 lags the desired data sampling point, the count value will be decreased, yielding a lower delay through delay element 267 and thus advancing the phase of the head clock signal and receive clock signal (and edge clock signal). If the early/late information 280 (predominantly indicates that the receive clock leads the desired data sampling point, the count value will be increased, yielding an increased delay through delay element 267 and thereby retarding the phase of the head clock signal and receive clock signal (and edge clock signal). As discussed in reference to FIGS. 2A-2C, this negative-feedback operation eventually will bring the rClk phase into the desired alignment with the data sampling instant and thereafter maintain the desired phase alignment through drift in temperature and voltage.

Figure 4B:
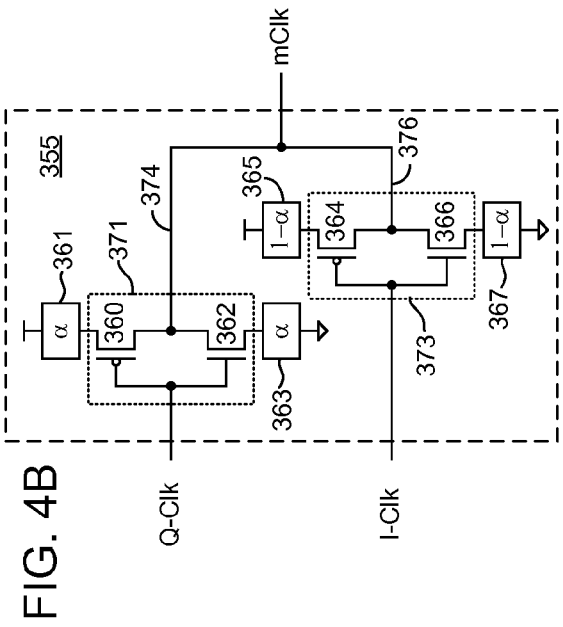
FIG. 4B illustrates an embodiment of a phase mixer that may be used to mix the I and Q clock signals; in effect interpolating between the two phase-offset signals to achieve a mixed clock signal (mClk) having the desired phase.
Figure 4A:
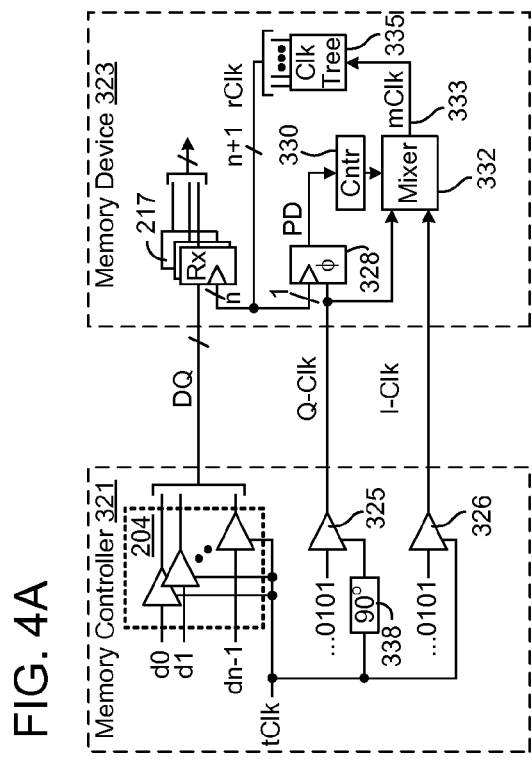
FIG. 4A illustrates another alternative system for establishing a desired, adaptively-updated data sampling point within a memory device without requiring a DLL, PLL or other continuously clocked circuitry within the memory device.

FIG. 4A illustrates another embodiment of a memory system that employs discontinous timing calibration to establish a desired, adaptively-updated data sampling point within a memory device 323 without requiring a DLL, PLL or other continuously clocked circuitry within the memory device. In contrast to the embodiments of FIGS. 2A and 3, however, circuitry for updating the phase of a sampling clock signal, rClk, is provided in memory device 323 instead of memory controller 321, thereby eliminating the need for back-channel delivery of timing calibration information to the memory controller. As in the embodiment of FIG. 2A, the memory controller 321 includes data transmission circuits 204 to output write data values d0-dn−1 to the memory device 323 in response a transmit clock signal (tClk), as well as transmission circuits 325 and 326 to output quadrature and in-phase timing signals, Q-Clk and I-Clk, respectively, in response to the transmit clock signal and a 90°-delayed version of the transmit clock signal, tClk90 (the 90° delay being achieved by a delay element 338 as generally described in reference to FIG. 2A). By this operation, transitions of the in-phase clock signal are phase aligned with edges of the data eyes, while transitions of the quadrature clock signal are phase aligned with midpoints of the data eyes, thus providing signals that may be phase-mixed within the memory device 323 to achieve a timing signal having an interpolated phase between the phases of the I and Q clock signals, I-Clk and Q-Clk. More specifically, referring to the memory device 323, the I and Q clock signals are supplied to a phase mixing circuit 332 which performs a weighted mixing of those signals to generate an interpolated (or mixed) timing signal 333 (mClk). The interpolated timing signal 333 is supplied to a clock tree circuit 335 which, in turn, yields multiple same-phase instances of a receive clock signal, rClk that is supplied to data receiver circuits 217 and clock receiver circuit 328 to time the sampling of data signals and the Q-Clk signal, respectively. Because the Q-Clk signal is nominally aligned to the midpoint of the data eye and exhibits substantially the same load and fan-out as the data signals (dummy loads may be coupled to the data links (DQ) to match the additional fan-out of the Q-Clk signal to the mixer input), the Q-Clk sampling result constitutes a phase-detect signal (PD) that indicates whether the sample-triggering rClk transition occurred early or late relative to the Q-Clk transition, and thus whether the phase of the rClk signal should be advanced or delayed. Accordingly, the phase detect signal is supplied to a counter 330 which increments or decrements a control value (count value) that is supplied to the phase mixing circuit 332 to control the relative weights applied in the interpolation between the in-phase and quadrature clock signals, thereby adjusting the phase of the mClk signal and thus the rClk signal in a direction that counters the phase error (i.e., advancing rClk in response to a phase detect signal (or sequence of phase detect signals) that indicate that rClk lags the desired data sampling point or delaying rClk in response to a phase detect signal or sequence of phase detect signals that indicate that rClk leads the desired data sampling point).

FIG. 4B illustrates an embodiment of a phase mixer 355 that may be used to mix the I and Q clock signals, I-Clk and Q-Clk; in effect interpolating between the two phase-offset signals to achieve a mixed clock signal (mClk) having a desired phase. In the particular embodiment shown, the phase mixer 355 includes two inverter amplifiers 371, 373 each formed by drain-coupled pair of transistors 360/362 and 364/366 (i.e., p-type metal-oxide-semiconductor (PMOS) transistors 362 and 364, and n-type MOS (NMOS) transistors 360 and 366). The source terminals of transistors 360 and 362 are coupled to supply and ground reference nodes, respectively, via active load elements 361 and 363, respectively, and the source terminals of transistors 364 and 366 are similarly coupled to supply and ground reference nodes via active load elements 365 and 367. The active load elements 361, 363, 365 and 367 function to attenuate the total current supplied to the inverter amplifiers 371, 373, thus providing control over the slew-rate and amplitude of the inverter outputs (374, 376), the signals contributed by the inverter amplifiers 371, 373 to the final mixed output signal, mClk. In the embodiment of FIG. 4B, the control values ($\alpha$) supplied to the active load elements 361, 363 for inverter amplifier 371 and the control values ($1-\alpha$) supplied to the active loads 365, 367 for inverter amplifier 373 sum to unity (or some predetermined reference) and have opposite signs (insofar as the adjustable value, $\alpha$). By this operation, the composite, interpolated signal mClk has a relatively constant slew-rate regardless of the value of cc, but a phase that is tilted toward either the Q-Clk phase or the I-Clk phase, depending on the control value, $\alpha$. That is, as $\alpha$ is increased, the current through active load elements 361 and 363 is increased, and the current through active load elements 365 and 367 is decreased (as the magnitude $1-\alpha$ is decreased), thereby adjusting the phase of the mClk signal toward the phase angle of the Q-Clk signal. Conversely, as the current through active load elements 365 and 367 is increased and the current through active load elements 361 and 363 is decreased, the phase of the mClk signal is adjusted toward the I-Clk signal. Note that while only two mixer input signals are shown in the embodiment of FIG. 4A/4B, complement signals /I-Clk and /Q-Clk may also be provided to the mixer circuit (e.g., to additional inverter amplifiers) to provide a set of four phase vectors equally spaced in phase within the cycle time of the transmit clock signal, thus enabling the mixer output to fall anywhere within the 360° phase angle of the transmit clock cycle. Also, additional clock signals (e.g., spaced 45° apart rather than 90°, or any other desired phase spacing) may be provided to the mixer circuit in alternative embodiments. Various other types of mixer elements may be used within the architecture of FIG. 4A in alternative embodiments.

Figure 4C:
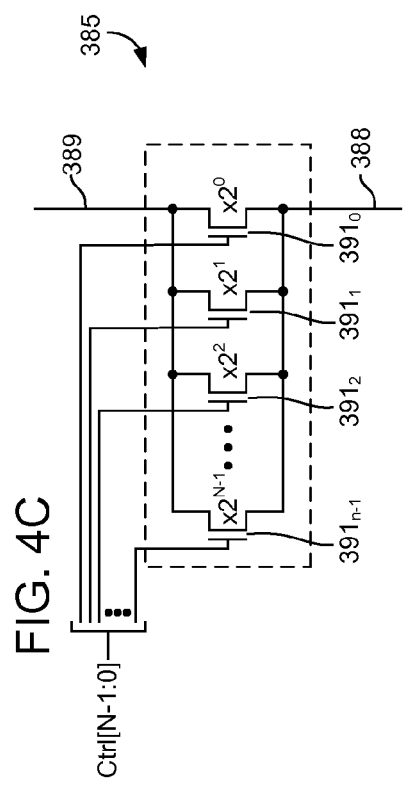
FIG. 4C illustrates an embodiment of an active load element that may be used to implement active load elements within the phase mixer of FIG. 4B.

FIG. 4C illustrates an embodiment of an active load element 385 that may be used to implement active load elements 361, 363, 365, 367 within the phase mixer of FIG. 4B. As shown, a set of N binary-weighted transistors $x2^0$-$x2^{N-1}$ (i.e., transistors that have transconductance values that are binary multiples of one another, ranging from a reference transconductance, $2^0$ to a transconductance $2^{N-1}$) are coupled in parallel, between an input node 388 and an output node 389, with the gate terminals of the transistors coupled to receive respective bits of a control value Ctrl[N−1:0], with voltages consistent with biasing the transistors in the saturation region to behave as current sources. The load element shown is formed by N-MOS transistors $391_0$-$391_{n-1}$ and may be coupled between the source terminal of N-MOS transistor 362 and ground to implement active load element 363, and similarly between the source terminal of N-MOS transistor 366 and ground to implement active load element 367. A counterpart load element formed by P-MOS transistors and having inverters to invert the incoming bits of the control value (thus providing active-load control signals) may be coupled between the source terminal of P-MOS transistor 360 and the supply node to implement active load element 361, and similarly between the source terminal of P-MOS transistor 364 and the supply node to implement active load element 365.

FIG. 5 illustrates another embodiment of a memory system that employs discontinuous timing calibration to establish a desired, adaptively-updated data sampling point within a memory device without requiring a DLL, PLL or other continuously clocked circuitry within the memory device. The system includes a memory controller 401 and memory device 403, each implemented generally as disclosed in reference to FIG. 4A, except that the phase mixer 332 of FIG. 4A is replaced by a phase control circuit 437 that adjusts the phase of a single-ended or differential head clock signal. More specifically, the memory controller 401 includes the data transmission circuits 204, and transmission circuits 325 and 326 for driving quadrature and in-phase clock signals to the memory device 403 (the in-phase clock signal being referred to as a head clock signal (HeadClk) in the embodiment of FIG. 5, and the quadrature clock signal being referred to as a phase clock signal (PhaseClk)). Within the memory device 401, a phase control circuit 437 (pCtrl) generates a phase-adjusted version of the head clock signal (referred to herein as the control clock 438, cClk) in accordance with a control value supplied by counter circuit 330. The control clock 438 is supplied to a clock tree circuit 335 which generates multiple same-phase instances of a receive clock signal (rClk) which are supplied in turn supplied to data receiver circuits 217 and a phase-clock receiver circuit 328. The phase clock receiver circuit 328 operates as described in reference to FIG. 4A to sample the incoming phase clock signal (i.e., as phase clock receiver samples the incoming Q-Clk signal in FIG. 4A) to generate a phase-detect signal (PD) that indicates whether the receive clock signal is transitioning early or late relative to a desired data sampling instant. The phase clock signal may also be supplied to a replica of the phase control circuit 437 (i.e., pCtrlR 439 or another circuit having load characteristics similar to phase control circuit 437) for load matching purposes. In any case, the phase detect signal is supplied to the counter circuit 330 which adjusts the control value supplied to phase control circuit 437 (and to replica phase control circuit 439 if provided) up or down accordingly.

FIG. 6A illustrates an embodiment of the phase control circuit that may be used to implement the phase control circuit 437 of FIG. 5 and that operates by adjusting an on-die termination impedance 451 to increase or decrease the amplitude (F) of a reflected head clock signal 450 (HeadClk), thus establishing an interference pattern that effects a positive or negative phase shift in the resultant control clock signal (cClk). The embodiment of FIG. 6B operates in a similar manner, except that the termination impedance 452 is coupled between the signal lines used to convey component signals of a differential head clock signal $450_a$ and $450_b$. The value of termination mismatch then determines the phase of the resultant control clock signal and its complement (cClk/cClkb).

FIG. 7 illustrates another embodiment of a phase control circuit that may be used to implement the phase control circuit 437 of FIG. 5. As shown, a sequence of stubs $513_0$-$513_{n-1}$ are coupled in series and switchably coupled to ground via respective transistors $515_0$-$515_{n-1}$ that are switched on or off according to respective bits of a control value ctrl[n−1:0], a value which may be stored, for example, within a programmable register of a memory device). By this arrangement, a stub having a variable length may be switchably coupled to the head clock signal input, thus introducing a reflected wave of variable timing to shape the resultant signal that is output as the control clock signal, cClk. FIG. 8 illustrates a counterpart circuit to that of FIG. 7 that may be used in conjunction with differential head clock signal formed by component signals $522_a$-$522_b$. In the phase control circuit of FIG. 8, series-coupled stub segments 525 are coupled to the input of each differential head clock line, and selectively intercoupled by transistors $526_0$-$526_2$ to provide a variable length stub. As in the embodiment of FIG. 7, the transistors are coupled to receive respective bits of control value ctrl[n−1:0] (of which only ctrl[2:0] are shown) and thus may be selectively switched on to alter the timing of the wave reflected by the selected stub length, thereby controlling the phase angle of the resultant control clock signal, cClk as described above.

Figure 9:
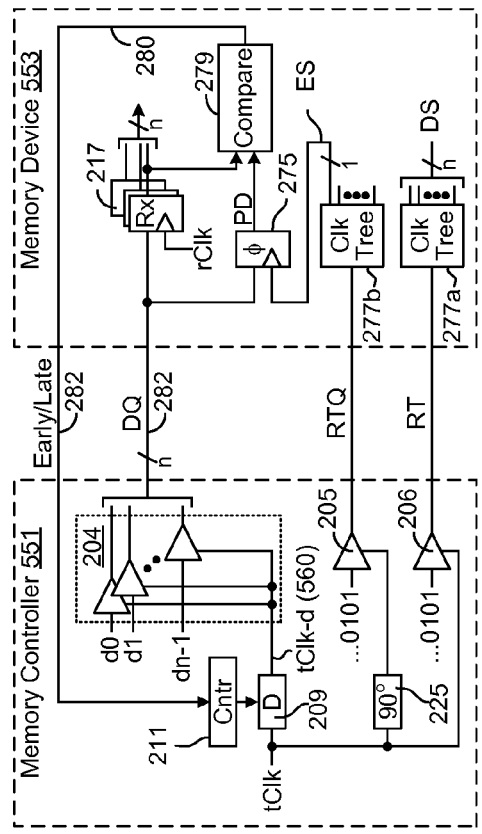
FIG. 9 illustrates another embodiment of a memory system that employs discontinuous timing calibration to establish a desired, adaptively updated data sampling point within a memory device.

FIG. 9 illustrates another embodiment of a memory system that employs discontinuous timing calibration to establish a desired, adaptively updated data sampling point within a memory device without requiring continuously clocked circuitry therein. In contrast to the memory systems of FIGS. 2A, 3, 4A and 5, which effect timing calibration by shifting the phase of the timing signal used to sample incoming data, the system of FIG. 9 operates by shifting the phase of the data itself, advancing or delaying the data transmit clock and thus the data transmission time to achieve a desired phase alignment between data eyes and a receive timing signal. One benefit of this approach is that a single pair of reference timing signals may be provided in common to each memory device in a memory system (or at least to subsets of memory devices within the memory system, such as each rank of memory devices or all the memory devices on a memory module), thus reducing the signaling resources relative to embodiments that issue one or more separately calibrated timing signals to each memory device. Also, because the timing calibration operation is carried out in the memory controller by adjusting the data transmission time, mixing circuits, phase control circuits or other circuitry for synthesizing receive timing signals as in the embodiments of FIGS. 4A-8 may be omitted from the memory devices, reducing complexity and cost.

Still referring to FIG. 9, the memory system includes a memory controller 551 and memory device 553 each having many of the components described above in reference to FIG. 2A. For example, the memory controller 551 includes a data transmission circuit 204 to output n-bits of data onto data links 210 during each transmit interval, and clock signal drivers 206, 205 to output a reference timing signal (RT) and phase-shifted reference clock signal (RTQ; 'Q' for a quadrature phase-offset in this example) to the memory device 553. The reference timing signal and phase-shifted reference timing signal (collectively, the reference timing signals) correspond generally to the head clock signal and phase clock signal of FIG. 2A, except that the delay circuit 209 and control circuit 211 (a counter in this example) are applied to generate a phase-adjusted transmit clock signal 560 (tClk-d) instead of a phase-adjusted head clock signal. Thus, the relative output times of the reference timing signals and data signals are still adjustable as in the embodiment of FIG. 2A, but are adjusted by shifting the data transmission time instead of the phase of the reference timing signals.

The memory device 553 includes data receivers 217, edge-sampling receiver 275 and compare circuit 279, and operates in generally the same manner as the memory device 263 of FIG. 3; generating timing calibration information (early/late information) by oversampling the incoming data signal in response to data and edge sampling signals (DS and ES) to capture samples at both the mid-point (data samples, D) and edges (edge samples, E) of data eyes. Instead of synthesizing the edge sampling signal from the data sampling signal, however, the edge sampling signal is produced by passing the phase-offset reference timing signal (RTQ) through a clock tree circuit 277b that matches the propagation delay of clock tree circuit 277a (itself provided to fan-out the reference timing signal (RT) into multiple instances of the data sampling signal, DS). By this arrangement, the data and edge sampling signals, DS and ES, experience nominally the same clock-tree propagation delay and thus exhibit the quadrature phase separation established by the 90° delay element 225 within memory controller 551. Accordingly, early/late timing information 280 is obtained whenever the data and edge samples supplied to the compare circuitry 279 do not match; the sampling signals (DS, ES) being deemed to transition early if the edge sample does not matches the immediately succeeding data sample (i.e., $E_i < > D_{i+1}$) and late if the edge sample does not match the immediately preceding data sample ($E_i < > D_i$), as generally described in reference to FIG. 3. The early/late information 280 is returned to the memory controller 551 through a dedicated communication path 282 (or shared communication path as discussed above), and supplied to counter 211 to adjust the propagation delay through delay element 209 and thus shift the data transmission time relative to the reference timing signals. When the data transmission time is shifted to the point at which ES transitions are aligned with transitions between data eyes (and DS transitions are aligned with data-eye midpoints), the edge samples will begin to toggle, signifying that the desired phase alignment has been established.

It should be noted that the desired phase offset between the reference timing signals is, at least in the embodiment shown, dictated by phase spacing between the edge and midpoint of the data eye. For example, in a double-data-rate system, the data eye is 180° in duration (i.e., half a clock cycle) so that the phase spacing between the reference clock cycles is 90° (i.e., quadrature phase spacing and hence the 90° phase offset between timing signals RT and RTQ). In a single data rate system in which data eyes span a full clock cycle, the phase offset between the reference timing signals will be 180° and in systems that transmit more than two bits per clock cycle (e.g., quad data rate, octal data rate and beyond) the phase offset will generally be less than 90°.

The discontinuous aspect of the timing calibration approaches described thus far, while obviating continuous memory device clocking and thereby saving power, may also increase susceptibility to phase drift over extended periods of non-activity (i.e., idle periods in which no data is being transmitted between the controller and memory device). In one embodiment, described in further detail below, mock data is transmitted during extended idle periods to provide for corrective timing adjustment as necessary to maintain a desired phase alignment (e.g., within a specified drift tolerance). In another embodiment, illustrated in FIG. 10, deterministic phase drift that results during extended idle periods is compensated by adding a corrective value 584 to the delay control value 222 (e.g., at least the most significant bits of the count value within counter 211) via summing circuit 585. More specifically, a transaction monitor 581 is provided to track the difference between tClk transitions (e.g., where tClk is toggled only during data transmission intervals) and a free-running reference clock signal or, in this example, frequency-divided version of the reference clock signal, divClk. In the embodiment shown, for example, the transaction monitor is a saturating counter circuit in which a difference count is decremented toward a minimum (saturated) value or incremented toward a maximum (saturated) value according to the relative transition frequency of tClk and divClk. By this arrangement, upon occurrence of an extended idle period (e.g., tClk not toggling), the difference count is increased (in response to divClk transitions) and will eventually saturate at the maximum value. By contrast, during data transmission periods, the tClk will transition at a higher frequency than divClk and thus cause the difference count to decrease, eventually saturating at the minimum value.

The difference count is supplied to a transient control circuit which generates or looks-up the corrective value 584 in response. In one embodiment, the corrective value is proportional (or inversely proportional) to the difference count, yielding a larger or smaller corrective contribution to the final phase control value 586 according to the level of data transmission activity. By this arrangement, the largest corrective contribution occurs at device startup or after waking up from an extended period of inactivity, in effect compensating for systematic error determined to occur during shutdown or sleep modes. As the level of data transmission activity increases, the corrective contribution is reduced. It should be noted that numerous circuits may be used to generate or select the corrective value 584 in different embodiments, including arithmetic computation circuits, lookup tables and the like. Also, parameters regarding the systematic error to be compensated (e.g., coefficients of polynomial expressions that may be used to model the systematic error) may be programmed within the transient control circuit to control the generation of the corrective value. Further, the transient control circuit may be omitted in an alternative embodiment, and the difference count applied directly to the summing circuit 585.

Figure 10:
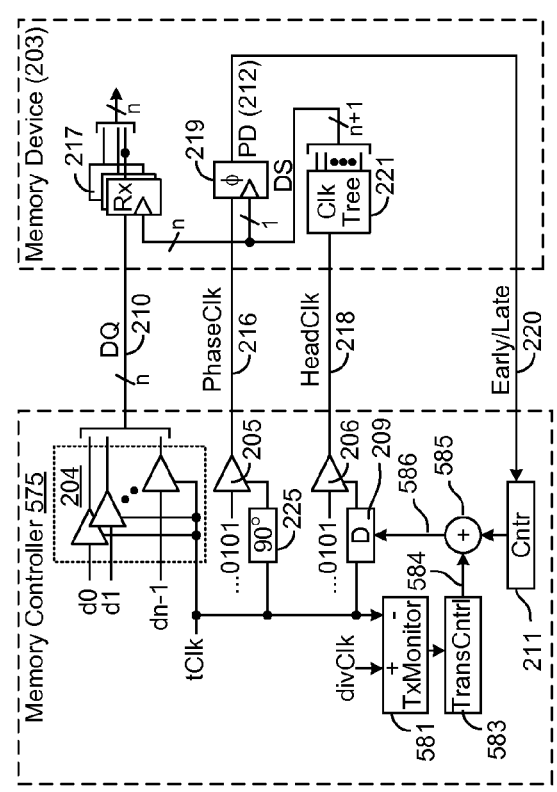
FIG. 10 illustrates an embodiment of a system having circuitry to compensate for phase drift that may occur due to cooling within the memory controller and/or memory device during idle periods (i.e., when no timing signal toggling occurs within the memory device and at least less timing signal toggling occurs within the memory controller) or system shut down.

Still referring to FIG. 10, the remaining components within the memory controller 575 and memory device 203 correspond to the components shown in FIG. 2A. The corrective contribution effected by the transaction monitor 581, transient control circuit 583 (if needed) and summing circuit 585 may be applied within any of the other discontinuous timing calibration approaches described in reference to FIGS. 3-9. Alternatively, instead of provide a corrective value to compensate for predetermined systematic error, occasional mock data transmissions may be carried out during idle periods to avoid undue timing drift. Such mock data transmissions may be initiated within the memory controller by circuitry similar to the transaction monitor that determines whether a threshold amount of time has elapsed without data transmission, or that the collective data transmission time within a given time interval is less than a predetermined percentage (or any other manner of measuring relative inactivity) and, in response, triggers transmission of mock data for timing calibration purposes. A system having circuitry to effect mock data transmission is described in further detail below.

Reflecting on the discontinuous timing calibration solutions described above, it should be noted that those embodiments in which phase-adjust operations are carried out within the memory controller (i.e., embodiments of FIGS. 2A, 3 and 9) are particularly well suited to point-to-point signaling topologies as only a single timing calibration setting is required per output driver (or per set of output drivers). By contrast, in a multi-drop topology in which data lines are coupled to more than one rank of memory devices (rank referring to a set of memory devices that are written to or read from in parallel, as a unit), distinct timing calibration settings may be needed for each rank of devices to account for rank-to-rank timing differences. Such rank-specific timing phases may be determined and selected on the fly in various embodiments, for example, by providing circuitry to generate and select between multiple differently-phased timing signals (head clock signals or delayed transmit clock signals) depending on which rank is to be accessed, or circuitry to generate and select between delay settings that yield differently-phased timing signals.

As briefly mentioned above, one benefit of the discontinuous timing calibration solutions of FIGS. 3 and 9 is that no source-synchronous timing signal need be transmitted along with the data signals. Instead, reference clock signals that are phase-offset from each other by the nominal phase angle between the midpoint and edge of the data eye (e.g., a quarter tClk cycle in the double-data rate embodiment of FIG. 9) are iteratively and adaptively phase shifted relative the data signals until a desired phase alignment is reached. More specifically, in the embodiment of FIG. 3, the head clock signal is phase shifted, and in the embodiment of FIG. 9, the tClk signal (and thus the data itself) is phase shifted. Note that the 90° phase shift between the data and edge sampling signals in FIG. 3 (i.e., edge clock signal 284 and receive clock signal 276) may alternatively be achieved within the memory controller as in FIG. 9 (with, for example, matching clock trees 277a and 277b provided within the memory device for delay matching purposes). Conversely, the 90° phase shift between the data and edge sampling signals in FIG. 9 (ES, DS) may be achieved through a calibrated 90° delay element within the memory device as in FIG. 3, obviating transmission of the phase-offset timing signal (RTQ). In either case, because no source synchronous timing signal is required, the reference timing signal(s) transmitted by the memory controller (or other device, such as a clock generator) may have any arbitrary phase with respect to the data signals. Accordingly, in one embodiment, a single pair of reference timing signals (e.g., RT and RTQ) may be transmitted to each of the memory devices within the memory system (alternatively, a distinct pair of reference timing signals may be transmitted to each of the memory devices on a common module, or to each rank of memory devices, or to groups of memory devices within a rank) thus obviating transmission of a separate source-synchronous timing signal to each memory device (or even multiple source-synchronous timing signals per memory device as may be done for conventional memory devices having data widths greater than 8-bits) and enabling the signal transmission resources otherwise consumed by source-synchronous timing signals to be reallocated to other purposes. In one embodiment, for example, a bi-modal memory controller is provided to support, in a multi-drop mode, a multi-drop strobe-based memory architecture (e.g., outputting a respective source-synchronous timing signal with each byte of data) and, in a point-to-point mode, a strobeless, point-to-point memory architecture in which signaling resources (e.g., chip-to-chip wiring and corresponding output drivers and receivers) otherwise used to convey source-synchronous strobe signals may be re-deployed to enable point-to-point connection of command/address signals, thus providing substantially higher command/address bandwidth than in conventional multi-drop command/address arrangements. Also, to obviate multiple reference clock signal phases (or transmit clock phases) and enable higher-signaling rates, output drivers conventionally applied to drive data signals to multiple ranks of memory devices via multi-drop data lines may be reallocated to drive point-to-point signals to individual memory ranks. Although the number of data links coupled between the memory controller and any single rank of memory devices is halved, the improved signal integrity may enable more than a two-fold increase in signaling rate, and thus achieve a net gain in data transfer bandwidth. Moreover, as discussed below, dynamic point-to-point techniques may be used to increase the number of point-to-point data links between controller and memory device in partially-populated multi-module memory systems.

Figure 11:
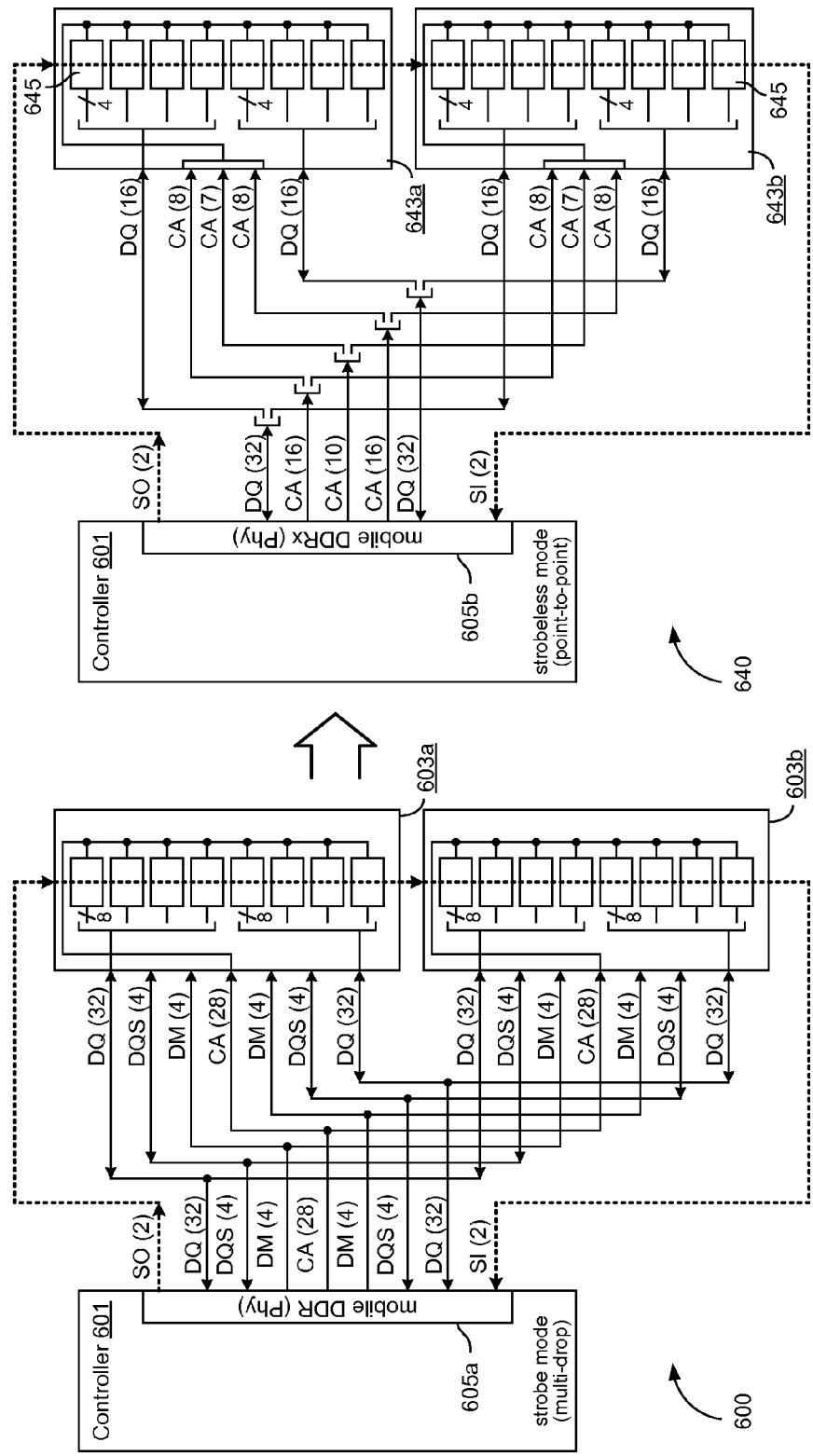
FIG. 11 illustrates an embodiment of a bi-modal memory controller and its application within a strobed multi-drop memory system and a point-to-point strobeless memory system.

FIG. 11 illustrates an embodiment of a bi-modal memory controller 601 and its application within two distinct memory systems: strobed multi-drop memory system 600 and point-to-point strobeless memory system 640. In the strobed multi-drop memory system 600 (the "strobed" system), the input/output (I/O) interface of the memory controller 601 is configured for operation as a double-data-rate memory control interface 605a and may be coupled in parallel to multiple memory modules 603a, 603b. More specifically, 64 DQ lines (shown as two sets of 32 DQ lines) are coupled to both memory modules in multi-drop fashion to enable read and write data to be transferred between the memory controller 601 and the memory devices 607 on a selected one of the modules 603a, 603b. A dedicated data strobe line (DQS) is provided for each set of eight DQ lines to enable a source-synchronous timing signal to be output from the transmitting device (i.e., the memory controller for write data and the memory devices on a selected memory module for read data) in synchronism with transmission of a corresponding data byte. Accordingly, eight DQS lines are provided in the embodiment shown and coupled in parallel to each of the memory modules 603a, 603b. Also, eight data mask lines (DM) are coupled in parallel to the memory modules 603a, 603b to convey mask signals during write operations, each mask signal indicating whether or not a corresponding byte of write data is to be stored within the recipient memory device 607 and thus enabling one or more bytes of data (other mask granularities may be supported) within an eight-byte data word to be masked out (not stored) in the write operation. Command and address (CA) information is also transmitted uni-directionally via a set of command/address lines (CA (28)), with each CA line being coupled in parallel to each memory device 607 in the memory system 600. In the particular embodiment shown, for example, the CA lines are coupled in parallel to each of the memory modules 603a, 603b and, on board each module, extend in a fly-by topology along the length of the module so that a signal propagating on a command/address line propagates past each memory device 607 on the memory module in succession, and thus arrives at each of the memory devices 607 at a progressively later time. Any of the signal paths may be statically terminated at one or both ends of the transmission path by on-chip or off-chip termination structures, or dynamically terminated at one or both ends of the transmission path by on-chip or off-chip termination structures (i.e., terminations that are switched in and out of circuit (or attenuated or increased) according to the IC to which signals are destined in a given transmission). Also, a serial output (SO) and serial input (SI), collectively referred to herein as a serial I/O (SIO) channel may be provided for system initialization (e.g., to establish initial timing settings and thus bootstrap system operation).

Unfortunately, the time-staggered arrival of command/address values at different memory devices 607 produces a device-specific timing skew between command/address arrival and arrival of corresponding write data (and, similarly, on the controller 601, a device-specific timing skew between command/address output time and arrival of corresponding read data) which becomes a significant source of error at higher signaling rates, necessitating timing compensation circuitry within either the memory devices 607 or the memory controller 601. Not only does the timing compensation circuitry add cost, but also may involve continuous clocking on the memory devices 607 and thus substantial power consumption even during periods of non-data transmission as discussed above.

In the strobeless point-to-point memory system 640 (the "strobeless" system), the input/output (I/O) interface within the memory controller is configured for operation as a double-data-rate memory control interface 605b having output drivers and receivers for driving distinct sets of signal lines coupled to respective memory modules. That is, point-to-point signal paths are provided between the memory controller and memory devices instead of the parallel, multi-drop configuration in strobed system 600. In the particular embodiment shown, for example, the 64 DQ lines that are individually coupled to multiple memory modules in the strobed multi-drop memory system 600 are routed in distinct sets of 32 DQ lines to respective (separate) memory modules 643a, 643b in the strobeless system 640. The improved signal integrity that results from avoiding the multi-drop stubs of the strobed system enables substantially higher data transfer rates over the point-to-point data links, including, in at least one embodiment, data transfer rates at least twice the data transfer rate applied over the multi-drop DQ lines of system 600 (e.g., 1.6 Gbps (gigabits per second) per data link in the strobed multi-drop system, and 3.2 Gbps per data link in the strobeless point-to-point system). Also, as discussed in further detail below, instead of transmitting a separate DQS signal to each memory device, a single pair of reference timing signals may be supplied to all the memory devices 645 on a given memory module 643 to support discontinuous timing calibration and thereby avoid transmission of continuously clocked signals to the memory devices. In the particular embodiment shown, the signaling resources freed by omission of DQS lines are reallocated to increase the number of command/address lines, enabling point-to-point command/address routing instead of the multi-drop command/address routing of strobed system 600. Consequently, the command/address transfer bandwidth in strobeless system 640 may be substantially increased (e.g., to a rate equal to the data rate), for example, to enable multiple access requests to be conveyed and serviced in an interval typically allocated to a single access request. As in the strobed multi-drop system, a relatively low-speed serial I/O channel (SI, SO) may be provided to support initialization of the memory system and various calibration operations including, without limitation, the discontinuous timing calibration operations described above.

Figure 12:
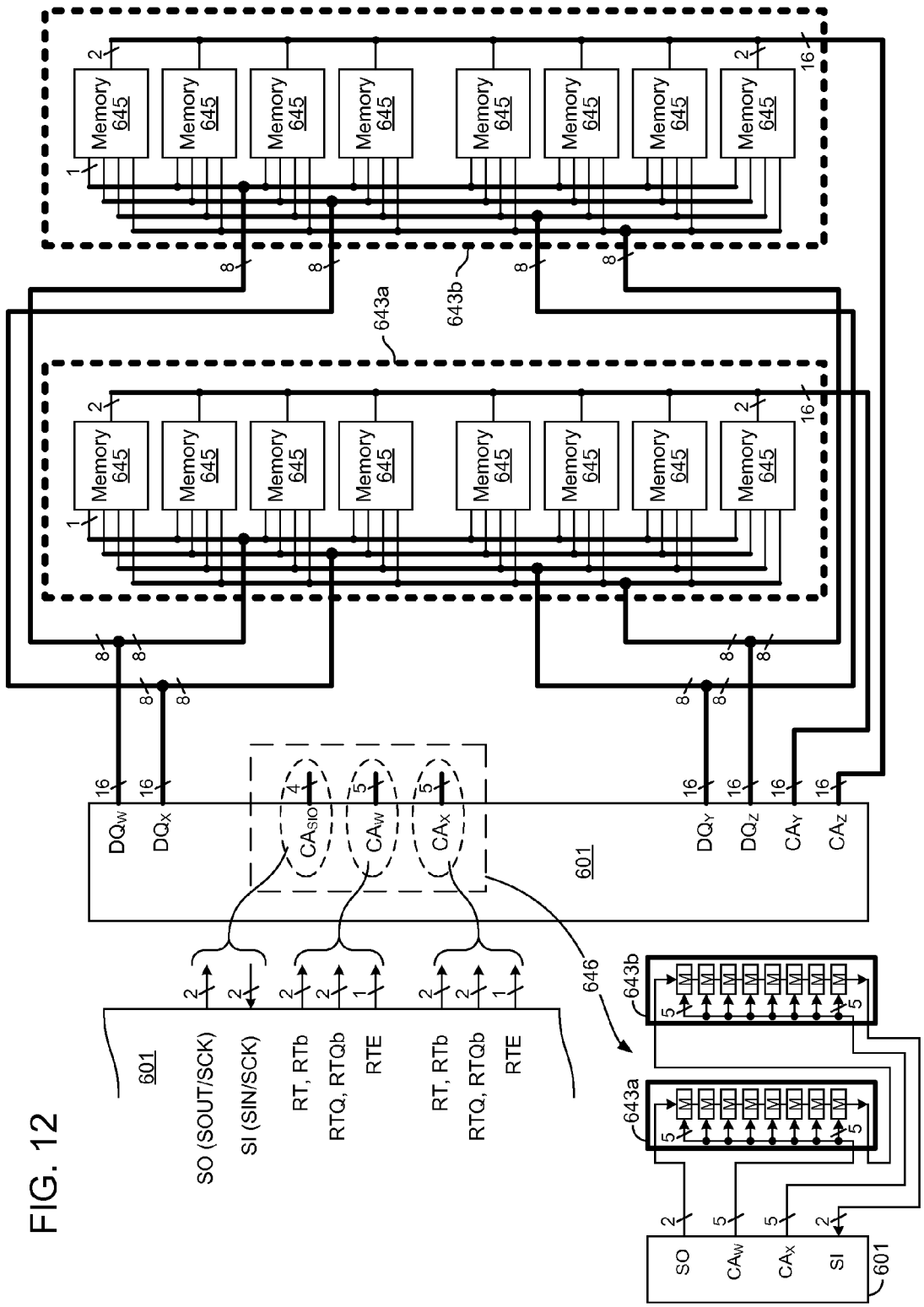
FIG. 12 illustrates a more detailed embodiment of the strobeless, point-to-point memory system of FIG. 11.

FIG. 12 illustrates a more detailed embodiment of the strobeless, point-to-point memory system of FIG. 11 (i.e., controller 601 operated in strobe mode). As shown, each of the two memory modules 643a and 643b includes eight memory devices 645 having a four-bit data interface coupled to a respective set of four DQ lines, and thus establishing 64 data I/O drivers within the memory subsystem (i.e., the memory modules) that may be coupled point-to-point (i.e., a direct communication path between controller and memory device with no other connection other than, possibly, a termination structure) to 64 counterpart data I/O drivers on the memory controller 601. Each of the memory devices 645 further includes a two-bit command/address input coupled to a respective pair of CA lines, and thus establishing 32 command/address receivers within the memory subsystem that may be coupled point-to-point to 32 counterpart CA output drivers on the memory controller 601, with the 8 pairs of $CA_Y$ output drivers (16 output drivers in all) coupled to respective memory devices on module 643a and the 8 pairs of $CA_Z$ output drivers coupled to respective memory devices on module 643b. Each memory device 645 on a given module further includes a 5-input timing interface to receive a common differential reference timing signal (RT, RTb), differential phase-offset reference timing signal (RTQ, RTQb) and timing-enable (RTE) signal. In one embodiment, shown at 646, two sets of reference timing signals (RT, RTQ and RTE) are output from the memory controller, a first set ($CA_W$) being supplied via a fly-by, multi-drop connection to all the memory devices on memory module 643a, and a second set ($CA_X$) being supplied via fly-by multi-drop connection, to all the memory devices on memory module 643b. The timing signals may be terminated by termination structures located on the memory module and/or one or more of the memory devices of the memory modules 643 (e.g., switchably coupled to the signaling lines within the memory device in response to strapping, one-time configuration or register programming within the memory device), and/or on board the memory controller 601 or proximally to the memory controller output. Note that the specific numbers of memory modules, memory devices per module, data I/O per memory device, command/address inputs per memory device, and signal lines used to form a given signaling link (e.g., one or two or some number in between according to whether single-ended, differential or multi-wire-encoded signaling is to be employed) are shown for purposes of example only and may be changed in alternative embodiments. For example, in one alternative embodiment, a ninth memory device 645 is provided on each memory module (e.g., to receive and output error checking/correction (ECC) information bearing on the data written to or read from the remaining eight devices), with commensurate increase in the number of data lines and command/address lines. Also, a single rank of memory devices is shown for each memory module 643. Multiple ranks of memory devices may be provided on each memory module (e.g., as in a dual-inline memory module, or DIMM) in alternative embodiments.

Figure 13A:
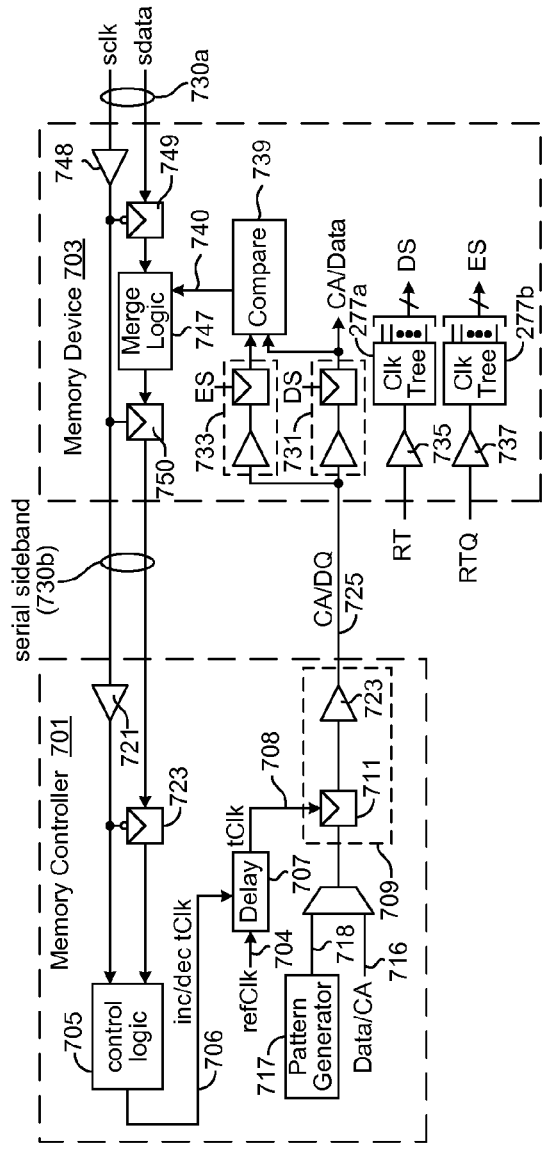
FIGS. 13A and 13B illustrate embodiments of circuitry that may be included on a memory controller and memory device to support discontinuous timing calibration operations in the strobeless memory system of FIGS. 11 and 12.
Figure 13B:
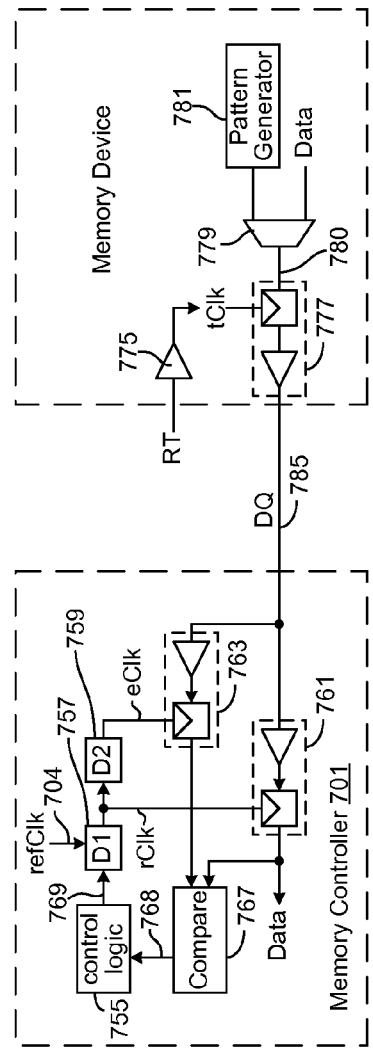

FIGS. 13A and 13B illustrate embodiments of circuitry that may be included on a memory controller 701 and memory device 703 to support discontinuous timing calibration operations in the strobeless memory system of FIGS. 11 and 12. More specifically, FIG. 13A illustrates phase-controlled signal transmission from memory controller 701 to memory device 703, and FIG. 13B illustrates counterpart phase-controlled signal transmission from the memory device 703 to the memory controller 701. In both cases, the discontinuous timing calibration approach described in reference to FIG. 9 is applied to adjust the phase of a transmit timing signal as necessary to deliver signals to the recipient device (memory device 703 or memory controller 701, depending upon the transfer direction) in a desired phase relationship with a sampling clock signal. Referring to FIG. 13A, for example, the phase of a transmit clock signal 708 (tClk) is advanced or delayed (e.g., by adjusting the time required for a reference clock signal 704, refClk, to propagate through a delay line 707) as necessary to achieve a desired relationship between the arrival time of a data signal or CA signal transmitted on link 725 and the reference timing signals, RT and RTQ, described in reference to FIGS. 11 and 12. The reference timing signals may be output from the memory controller 701 (generated by gating the reference clock signal 704, for example) or from another device (e.g., a dedicated clock generator) and are supplied via input buffers (735a, 735b) to matching clock tree circuits 277a and 277b, respectively to generate the data and edge sampling signals, DS and ES. As in the embodiment of FIG. 9, the data and edge sampling signals are provided to sampling circuits 731 and 733 (each formed by an input buffer and edge-triggered latching element) to time the capture of data and edge samples therein. The data and edge samples are output from the sampling circuits 731, 733 to compare circuitry 739 which operates as described above to generate early/late information 740 (i.e., indicating whether the samples were captured early or late relative to a desired sampling point). The early/late information 740 is supplied to a merge logic circuit 747 which inserts the information within a serial data stream propagating on the system-wide serial I/O loop, thus returning the early/late information 740 to the memory controller 701 via serial sideband path 730. In one embodiment, the serial sideband channel includes one signal link to convey a serial clock, and another to convey serial data. The serial clock is repeated within each IC in the memory system by a buffer amplifier 748 (arriving at an sClkIn node and being output at an sClkOut node). The falling edge of the serial clock strobes incoming data into (i.e., triggers a sampling operation within) input latch or flip-flop element 749, and the rising edge of the serial clock strobes outgoing data (formed by the incoming data and data merged with the incoming data by operation of merge logic 747) within output latch or flip-flop 750. Various other serial protocols may be used and, more generally, any other type of sideband or dedicated communication channel may be used to convey early/late information to the memory controller 701 in alternative embodiments.

The memory controller 701 includes control logic 705 to extract the early/late information 740 from the serial data stream (captured within input latch 723 in response to falling edges of the serial clock signal buffered by amplifier 721, both counterparts to the buffer 748 and latch 749 within the memory device(s)) and apply the information to update a delay control value 706. For example, in one embodiment, the control logic 705 includes a counter circuit that is incremented or decremented in response to the early late information, with most-significant-bits (or all bits) of the count value being output as the delay control value 706. The delay control value 706, itself incremented or decremented by the early/late information or averaged or otherwise filtered version thereof, is supplied to delay line 707 to adjust the phase of the transmit clock signal, advancing the tClk phase when the early/late information predominantly indicates that the data/edge sampling signals lag the desired sampling point, and retarding the tClk phase when the early/late information predominantly indicates that the data/edge sampling signals lead the desired sampling point.

Still referring to FIG. 13A, during extended idle periods in which no data access operations are being performed within the memory device 703, mock data and/or CA signals may occasionally be transmitted to the memory device 703 to maintain timing calibration within a predetermined or programmed precision. In the embodiment shown, for example, a pattern generator 717 (e.g., pseudo random bit generator or other pattern generating circuit) is provided to generate mock data or CA information ("mock signals"), and a bypass multiplexer 715 is provided to select either the mock signals or genuine data/CA signals to the output driver 709 formed by latch element 711 and amplifier 713 (i.e., bypass the genuine data/CA source during idle). In one embodiment, the memory controller 701 includes circuitry for monitoring the incoming memory access request frequency (e.g., as described above in reference to FIG. 10) and to switch from genuine or mock signaling (i.e., by changing the state of a select signal provided to bypass multiplexer 715) whenever the memory access frequency falls below a predetermined or programmed threshold. Alternatively, the monitoring circuitry may track the memory access frequency directly and switch the bypass multiplexer 715 to insert mock transmissions as often as necessary to maintain the desired timing calibration.

Turning to the read timing calibration circuitry shown in FIG. 13B, the memory device 703 includes an output driver 777 (formed by a latch element and buffer-amplifier as described above) that is strobed or triggered by a buffered version 776 of the incoming reference timing signal RT (buffered by buffer 775), and also includes a pattern generator 781 to generate mock data and a bypass multiplexer 779 to enable selection between the mock data and genuine data (i.e., genuine data including, for example, read data retrieved from the memory core (not shown) or a status register or other storage within the memory device 703). In one embodiment, the bypass multiplexer 779 is switched to mock data transmission (bypass state) in response to a command from the memory controller, delivered via the command/address path and/or serial I/O channel.

The memory controller 701 includes data and edge samplers 761 and 763, each formed by a buffer-amplifier and latch element, to sample incoming data signals in response to a receive clock signal (rClk) and edge clock signal (eClk) and thus generate data and edge samples that may be compared within compare circuit 767 to generate early/late information 768. The early/late information 768 is supplied to a control logic circuit 755 (which may be included within the control logic circuit 705 shown in FIG. 13A to adjust a delay control value 769. The delay control value 769 is applied, in turn, to delay line 757 (D1) to control the time required for reference clock signal 704 to propagate through the delay line 757 (the output of which is rClk) and thus control the rClk phase. The receive clock signal supplied to the data sampler 761 to trigger the data sampling operation therein, and also propagates through a 90° delay element 759 to produce the edge clock signal, which is supplied, in turn, to the edge sampler 763. Different phase delays may be implemented within delay element 759 in different embodiments Referring to FIGS. 13A and 13B, in one embodiment, the memory controller 701 toggles the reference timing signals, RT and RTQ, only when necessary to time signal reception or signal transmission within the memory device 703. That is, during idle periods and when no mock data is to be transmitted, the memory controller 701 maintains the reference signals in a steady state (e.g., parking the reference signals in a logic high, logic low or an intermediate state) to reduce power consumption within the memory device 703. When memory access operations are to be performed, the memory controller 703 toggles the reference timing signals to time reception of write data and corresponding write command signals and to time return transmission of read data. The memory controller 701 may also park the reference signals during the memory core access interval between registration of an activation command and/or read command within the memory device 703, and the time at which read data becomes available for output from the memory device.

Figure 14:
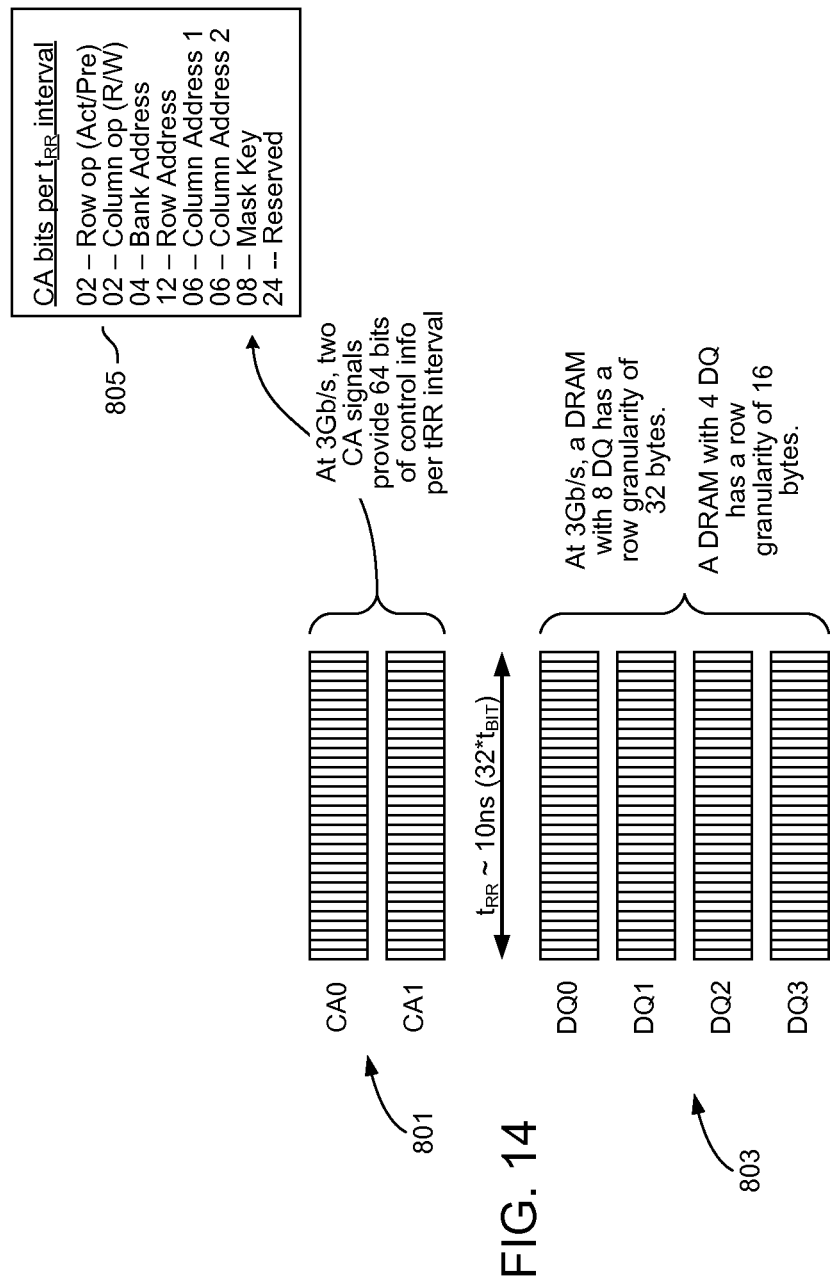
FIG. 14 illustrates an exemplary protocol for command/address and data transmission over the point-to-point signaling paths coupled between the memory controller and each individual memory device in the system of FIG. 12.

FIG. 14 illustrates an exemplary protocol for command/address and data transmission over the point-to-point signaling paths coupled between the memory controller and each individual memory device in the system of FIG. 12. Assuming a 10 nS interval imposed between row-activation commands directed to different storage banks within the memory core (i.e., tRR=10 nS), and a 3.2 Gb/s signaling rate over both the data and command/address signaling paths, then 32 bits of information may be transferred between the memory controller and memory device on each individual signaling link. That is, as shown, 64 bits of command/address information may be conveyed per tRR interval via the 2-bit CA interface 801, and 128 bits of read or write data may be conveyed per tRR interval via the 4-bit data interface 803. In one embodiment, the 64 bits available for command/address transfer per tRR interval is allocated as shown at 805, with two row operations (one activation and one precharge) directed to an address-specified row within an address-specified bank, two column operations directed to respective data columns within an activated row of data (two reads, two writes or one of each directed to respective column addresses) with two bits provided to specify one or more row operations (e.g., 1=row activation, 0=precharge), two bits to specify a column operation (read write), a 4-bit bank address to specify one of 16 banks, a 12-bit row address to specify one of 4096 rows, and two 6-bit column addresses each to specify one of 64 columns within an activated row. A mask key (8-bits in this example) may be provided to specify masking operations within write conveyed via the data interface 803.

Although embodiments described above relate to discontinuous timing calibration operations for adjusting the sampling time of signals transferred between a pair of integrated circuits (i.e., timing calibration for chip-to-chip signaling), the techniques and circuitry described may also be employed within a single integrated circuit device (i.e., on a single substrate or die) as in, for example, a system-on-chip or other large-scale circuit integration in which signals generated in one region of the substrate are to be transmitted to one or more other remote regions of the substrate and in which it may be desirable to avoid continuous clocking in those remote regions. As a more specific example, it may be desirable to employ embodiments generally as described in reference to FIGS. 2-14, except with the transmit-side circuitry and receiver-side circuitry disposed in separate regions of a common integrated circuit die (or semiconductor chip), and coupled to one another via one or more on-chip transmission lines. Herein, "transmission line" refers to an energy transfer medium on which a propagating signal wave has a voltage or current that depends on its distance along the line, as opposed to a transfer medium in which the voltage may be assumed to the same at all points.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of embodiments of the invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A method of operating a memory controller, the method comprising:
   transmitting data signals to a memory device over each one of at least two parallel data links;
   sending a timing signal to the memory device on a first dedicated link, the timing signal having a fixed phase relationship with the data signals;
   driving a data strobe signal to the memory device on a second dedicated link;
   receiving phase information from the memory device, the phase information generated internal to the memory device and based on a comparison between the timing signal and a version of the data strobe signal internally distributed within the memory device to sample the data signals; and
   adjusting a phase of the data strobe signal relative to the timing signal based on the received phase information.

2. The method according to claim 1, wherein the timing signal is sent at predetermined time intervals.

3. The method according to claim 1, wherein the phase information represents a phase difference between the timing signal and the version of the data strobe signal internally distributed within the memory device.

4. The method according to claim 3, wherein the receiving phase information includes:
   receiving data indicating early/late phase offsets between the timing signal and the version of the data strobe signal internally distributed within the memory device; and
   generating a count value based on the early/late phase offsets.

5. The method according to claim 4, further comprising:
   feeding the count value to a variable delay element, the variable delay element imparting a relative delay between the timing signal and the data strobe signal; and
   wherein adjusting the phase of the data strobe signal relative to the timing signal includes varying the relative delay between the timing signal and the data strobe signal in response to the count value.

6. The method according to claim 4, further comprising:
   feeding the count value to a variable delay element, the variable delay element imparting a delay to the data strobe signal; and
   wherein adjusting the phase of the data strobe signal relative to the timing signal includes varying the delay imparted to the data strobe signal in response to the count value.

7. The method according to claim 1, wherein the timing signal comprises a clock signal.

8. The method according to claim 1, wherein the phase information represents a deviation from an ideal phase alignment between the timing signal and the version of the data strobe signal internally distributed within the memory device.

9. The method according to claim 8, wherein the transmitting, driving and receiving is carried out via a dynamic random access memory (DRAM) protocol.

10. A memory controller comprising:
    data transmit circuitry to transmit data signals to a memory device over each one of at least two parallel data links;
    a timing signal generator to send a timing signal to the memory device on a first dedicated link, the timing signal having a fixed phase relationship with the data signals;
    a data strobe driver to drive a data strobe signal to the memory device on a second dedicated link;
    receiver circuitry to receive phase information from the memory device, the phase information generated internal to the memory device and based on a comparison between the timing signal and a version of the data strobe signal internally distributed within the memory device to sample the data signals; and
    a phase adjustment circuit to adjust a phase of the data strobe signal relative to the timing signal based on the received phase information.

11. The memory controller according to claim 10, wherein the timing signal generator sends the timing signal at predetermined time intervals.

12. The memory controller according to claim 10, wherein the phase information represents a phase difference between the timing signal and the version of the data strobe signal internally distributed within the memory device.

13. The memory controller according to claim 12, wherein the receiver circuitry includes:
    an input to receive data indicating early/late phase offsets between the timing signal and the version of the data strobe signal internally distributed within the memory device; and
    a counter circuit to generate a count value based on the data indicating early/late phase offsets.

14. The memory controller according to claim 13, wherein the phase adjustment circuit comprises:
    a variable delay element coupled to the counter circuit, the variable delay element imparting a relative delay between the timing signal and the data strobe signal in response to the count value.

15. The memory controller according to claim 13, wherein the phase adjustment circuit comprises:
    a variable delay element coupled to the counter circuit and the data strobe driver, the variable delay element imparting a delay to the data strobe signal in response to the count value.

16. The memory controller according to claim 10, wherein the timing signal generator comprises a clock signal generator, and the timing signal comprises a clock signal.

17. The memory controller according to claim 10, wherein the phase information represents a deviation from an ideal phase alignment between the timing signal and the version of the data strobe signal internally distributed within the memory device.

18. The memory controller according to claim 10, embodied as an integrated circuit (IC) dynamic random access memory (DRAM) memory controller.

19. An integrated circuit (IC) chip comprising:
memory control circuitry, the memory control circuitry including
- means for transmitting data signals to a memory device over each one of at least two parallel data links;
- means for sending a timing signal to the memory device on a first dedicated link, the timing signal having a fixed phase relationship with the data signals;
- means for driving a data strobe signal to the memory device on a second dedicated link;
- means for receiving phase information from the memory device, the phase information generated internal to the memory device and based on a comparison between the timing signal and a version of the data strobe signal internally distributed within the memory device to sample the data signals; and
- means for adjusting a phase of the data strobe signal relative to the timing signal based on the received phase information.

20. The IC chip according to claim 19, wherein the timing signal is sent at predetermined time intervals.

\* \* \* \* \*